United States Patent [19]
Khazam et al.

[11] Patent Number: 5,786,697
[45] Date of Patent: Jul. 28, 1998

[54] CAPACITIVE OPEN-CIRCUIT AND SHORT-CIRCUIT TESTS OF COMPONENT CONNECTIONS TO CIRCUIT BOARDS

[75] Inventors: Moses Khazam, Lexington; Steven M. Blumenau, Royalston, both of Mass.

[73] Assignee: Genrad, Inc., Westford, Mass.

[21] Appl. No.: 390,065

[22] Filed: Feb. 17, 1995

Related U.S. Application Data

[63] Continuation-in-part of Ser. No. 188,385, Jan. 27, 1994, Pat. No. 5,391,993.
[51] Int. Cl.⁶ .................... G01R 31/04; G01R 31/312
[52] U.S. Cl. .................................. 324/537; 324/679
[58] Field of Search ................. 324/519, 537, 324/538, 660, 676, 679, 686, 687, 756, 158.1

[56] References Cited

U.S. PATENT DOCUMENTS

| | | | |
|---|---|---|---|
| 5,124,660 | 6/1992 | Cilingiroglu | 324/538 |
| 5,254,953 | 10/1993 | Crook et al. | 324/538 |
| 5,363,048 | 11/1994 | Modlin et al. | 324/519 |
| 5,426,372 | 6/1995 | Freve | 324/538 |
| 5,469,064 | 11/1995 | Kerschner et al. | 324/537 |
| 5,486,753 | 1/1996 | Khazam et al. | 324/537 X |
| 5,489,851 | 2/1996 | Heumann et al. | 324/537 |
| 5,557,209 | 9/1996 | Crook et al. | 324/537 |
| 5,625,292 | 4/1997 | Crook et al. | 324/538 |
| 5,696,451 | 12/1997 | Keim et al. | 324/687 |

FOREIGN PATENT DOCUMENTS 2151360   7/1985   United Kingdom.

*Primary Examiner*—Glenn W. Brown
*Attorney, Agent, or Firm*—Cesari and McKenna, LLP

[57] ABSTRACT

A method for testing for short circuits between UUT pins that are nominally connected to nodes on a circuit board which the UUT is mounted and open circuits between pins and nodes nominally connected thereto. The method is used in a system that responds to the capacitances between a plate positioned above the UUT and respective nodes to which the pins are connected. A group of pins are selected such that no two pins of the group are nominally connected together. The pins are connected together in the tester and if the capacitance between the plate and the pin group is less than a first threshold an open circuit is indicated. The presence of a short circuit is indicated by a capacitance greater than a second threshold that is greater than the first threshold.

3 Claims, 6 Drawing Sheets

CAPACITIVE OPEN-CIRCUIT AND SHORT-CIRCUIT TESTS OF COMPONENT CONNECTIONS TO CIRCUIT BOARDS

This application is a continuation-in-part of U.S. patent application Ser. No. 08/188,385, filed Jan. 27, 1994 now U.S. Pat. No. 5,391,993 dated Feb. 21, 1995.

BACKGROUND OF THE INVENTION

The present invention concerns testing electronic-circuit boards and in particular detecting open circuits between component pins and the board tracks to which they should be electrically connected. The invention also concerns the detection of short circuits by using the measurements made in the course of open-circuit detection.

Testing for proper functioning of electronic-circuit boards has now been performed automatically for decades, and for most of that time various test techniques have been used to detect open circuits between component pins and the board tracks to which they should be soldered or otherwise electrically connected. For much of the history of board testing, however, such open circuits have been a relatively minor concern. They occurred relatively infrequently, so manual probing to diagnose them was acceptable in most situations.

We refer here to "manual" probing because most high-volume tests are performed in a more-automatic manner. Typically, the board is placed in a "bed of nails" fixture, in which a large number of spring probes, or "nails," simultaneously contact respective nodes on the bottom of the board to be tested, and a user does not have to position those probes manually. Various automatic switching mechanisms in an automatic circuit tester then connect the nails to various driving and sensing circuitry, causing stimulus to be applied to the board and its response to be recorded.

In the past, this approach was not typically used to detect open pins because the nails typically contact the "bottom," or non-component side, of the usual, "one-sided" circuit board, while the most-straight-forward way of testing for the proper pin connection involves placing a probe on the component pin, which is on the other side of the board, to determine whether a signal applied to the board track appears on the pin.

But open pins have recently become a problem of greater significance. The reason for this largely is that pin pitches have become increasingly fine, and this has made it harder to register the pin accurately with its proper location on the board. Tester manufacturers therefore began to put some effort recently into providing more-automatic means of testing for open component pins. Obviously, the best approach would be one that can be performed through the bed of is nails exclusively, without the additional fixturing complexity that affording physical access to the board's component side necessitates. Automatic-type access to the component side of the board typically necessitates the use of so-called clamshell fixtures, which employ two arrays of probes, one for each face of the circuit board. Such an arrangement exacts penalties in fixture cost and throughput, and it is a large part of the reason why manufacturers have traditionally favored one-sided boards: they could be tested without clamshell fixtures.

Efforts at developing open-pin tests therefore initially concentrated on approaches that required only a single, bed-of-nails probe array, and some approaches have been developed that can detect open pins in a wide range of situations without resorting to clamshell fixtures. But there are certain limited test situations that thus far have not proved amenable to one-sided open-circuit testing. These are usually situations in which the tester's instrument complement is rather limited and/or the board employs components, such as custom ASICs, for which adequate diagnostic information is not available. Because an early solution to the problem of finding one-sided tests for open circuits in these situations began to appear unlikely, tester manufacturers eventually concluded that they needed to provide tests that resort to clamshell fixtures. It is to tests of this sort that the invention described below is directed.

Probing considerations on the component side of the board differ from those that prevail on the non-component side. As a probe target, for instance, a component pin is much more fragile and sometimes more difficult to hit. Moreover, it is virtually impossible to make actual contact with a pin of a surface-mount-technology (SMT) component. So component-side probes proposed for high-volume open-circuit tests have usually been of the non-contact type and typically capacitive.

In a typical test that employs a capacitive probe, the stimulus signal is applied (typically from the non-component side) to a track to which the component pin in question should be connected. Of course, the pin is mounted in a component package that houses an integrated circuit, and the internal connection between the pin and the integrated circuit is often provided by a lead frame. The lead frame provides a conductive surface that can capacitively couple the pin signal to a capacitive probe in the form of a conductive plate placed adjacent to the component package's upper surface.

Now, to determine whether the connection is made properly, the capacitive open-circuit-testing technique essentially measures the series capacitance in the path from the board track through the pin and the lead frame to the capacitive probe. If there is a connection between the track and the pin, that capacitance consists essentially of the capacitance between the capacitive probe and the lead-frame leg connected to the pin being tested. But an improper connection interposes a further, much smaller capacitance between the component pin and the track to which it should be connected. This results in a very low series capacitance and thus a very high impedance, which greatly attenuates the signal coupled from the path to the probe. This absence of a significant signal can therefore be taken as an indication of an open pin.

While the foregoing description of a capacitive test describes the manner in which it should ideally work, complications arise in practice. Board topology can result in capacitances that parallel the connection-dependent capacitance of interest and thus result in significant measured capacitance even when the pin is open. And setting a threshold to accommodate such connection-independent values is complicated by the fact that the capacitance that indicates proper connection for one pin may not be such an indication for another pin. Indeed, there are often differences even for corresponding pins of the same type of board component mounted in different locations on a board. A result of this fact is that capacitive testing is not particularly reliable if the same threshold level is used as the criterion for determining the proper connection of every pin; using a high level uniformly tends to result in an unnecessarily high frequency of false open-circuit indications, while using a low level uniformly tends to allow too many open circuits to pass undetected.

To increase reliability, a tester will typically be subjected to "training." In training, capacitance measurements are made for the various pins of a known good board of the type to be tested. The values thus measured are stored and employed in imposing the criteria by which connection integrity is judged. Specifically, if the capacitance measured for a given pin on a known good board has a given value, then the corresponding pin on a board under test is judged not to be connected properly if the measured capacitance is less than, say, a predetermined percentage of the capacitance measured for that pin on the known good board. By thus employing training in connection with the testing process, the reliability of the testing process is considerably increased.

SUMMARY OF THE INVENTION

But we have found that even further reliability can be achieved if the results of the training operation are so processed as to estimate that fraction of the measured capacitance that is independent of the connection state of the pin being tested. For each pin, a certain—although in some cases minuscule—capacitance remains even when the pin is not connected. The magnitude of this connection-independent part of the capacitance measurement varies from pin to pin for various reasons, a major one of which is that significant lengths of the board tracks to which some pins should be connected may be disposed under the position of the capacitive-probe plate, thereby providing capacitance—i.e., the capacitance between that track and the probe plate—that is not only significant but also independent of whether the device pin is properly connected. We have recognized that the test can be made more reliable if the threshold is set in a way that depends not only on the total capacitance measured for a pin during training but also on the open-circuit capacitance value.

Of course, one could determine this value for every pin by simply opening each pin in sequence on a reference board. But even if this opening and reconnecting of device pin s could be done reliably without introducing unintended faults in the erstwhile known good board, it would add greatly to the time required for test preparation.

We have discovered that a good approximation to the part of the capacitance measurement that is independent of the connection state can be made, without physically opening the reference board's pins, by employing certain simply applied processing expedients that take advantage of the similarities and symmetries in the structures that cause the capacitances of interest in the open-circuit test.

Specifically, the (connection dependent) component of the measured capacitance that results from the lead-frame conductor associated with a given device pin depends on the position of the pin in a spatially periodic manner. That is, the pins at the corners of the device tend to be connected to the integrated circuit by conductors that have a relatively high surface area, while those more near the center of a given side of the IC package tend to be connected by conductors of less surface area. Additionally, the surface area—and thus the capacitance—of the lead-frame conductor for a pin at a given position is typically the same as that for the pin at the opposite spatial position on the package. (The "opposite" position can be the position diametrically opposite or opposite with respect to one of the package's axes of symmetry.) Furthermore, the change in surface area from the conductor for one pin to that for the next also follows a relatively regular pattern.

One or more of these factors can be employed in most cases of interest to make a good estimate of that part of the measured capacitance that depends on whether the pin being measured is properly connected.

Briefly, a pin whose measurement during training is deduced, in ways that will be explained below, to have an excessive connection-independent component may be assigned an estimate of the connection-dependent part of the measurement by replacing its initial measurement by an average of one or more pins spatially opposite the pin in question. Alternatively, that pin's measurement may be replaced by, say, the average of the measurements taken for pins on either side of it. Or the adjustment value given to a pin may be equal to the measurement taken for an adjacent pin increased or decreased by the average difference between adjacent measurements.

We have found that using one or more of these techniques produces adjustment values, for at least certain classes of pins, that tend to approximate the values that would have resulted if factors such as driven tracks close to the capacitive probe did not add to the measured value a component that is independent of the connection state of the pin. The threshold employed for the actual test can then be set by subtracting from the measured value on the known good board a fraction of this estimate of its connection-dependent part. Use of such a threshold considerably increases the reliability of the capacitive test and enables it to detect open circuits reliably in many situations in which conventional methods do not.

Undesired connections, i.e. "shorts" between component pins are also the subject of board tests. Shorts testing can easily be accomplished by testing routines known in the board testing art. However, the open-circuit testing method described herein provides the basis for concurrent shorts testing, again saving time in testing a circuit board.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
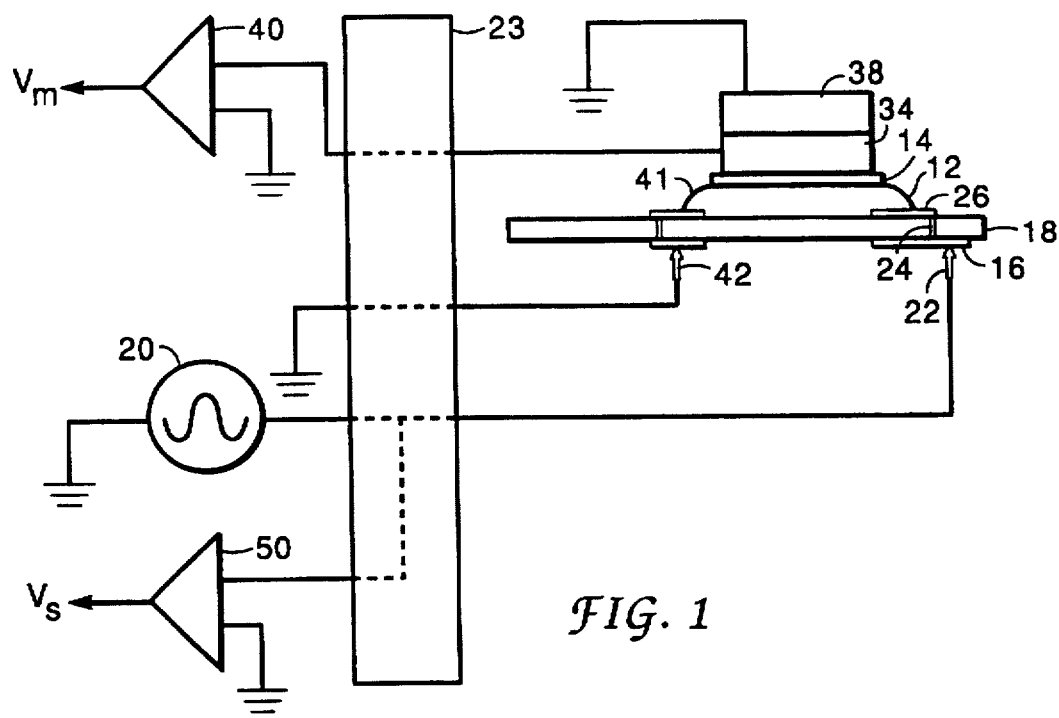
FIG. 1 is a schematic diagram of a measurement setup for detecting open circuits.

FIG. 1 depicts a test setup for determining whether various pins such as pin 12 of a board device 14 are properly connected to tracks, or "nodes," 16 on a circuit board, or UUT ("unit under test") 18. An AC source 20 applies an excitation signal to the track 16 by means of a contact probe, or "nail," 22, which is typically one of a large number of such nails on a "bed of nails" fixture of the type conventionally employed by high-volume testers for applying signals to UUTs. To test a different pin's connection, the source 20 is connected to a different one of those nails, and thus to a different node, by a change in the state of a multiplexer by which test instruments are selectively connected to the nails.

On the UUT, the pin 12 is supposed to be electrically connected to node 16, and such a connection may result from the pin's extending through a hole in the board 18 so as to reach node 16, to which it would be soldered or similarly connected electrically. But FIG. 1 shows instead that node 16 extends by way of a via 24 to an upper-board section 26, where the pin 12 is connected instead. The illustrated approach is characteristic of surface-mount-technology ("SMT") devices, which tend to predominate on boards that require component-side access. The pins of such devices lend themselves particularly to the test techniques to be described below, but through-hole-pin devices, too, occur on boards that are tested by capacitive probing.

Figure 2:
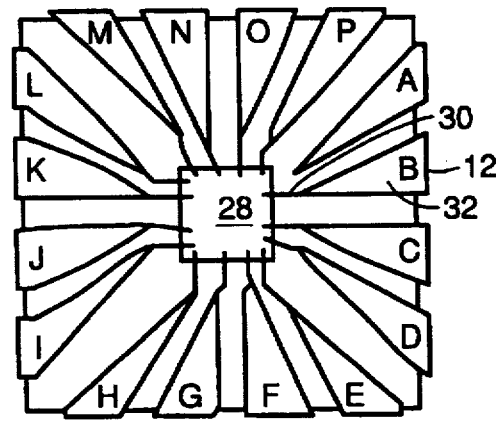
FIG. 2 is a plan view of a board component with the outer package removed.

Now, if the upper part of the package of component 12 were removed, the result would be a view similar to FIG. 2, which depicts the actual integrated circuit and the lead frame that connects it to pin 12 and other pins. The actual integrated circuit 28 is connected by bond wire 30 to a lead-frame conductor 32 that terminates in pin 12. As FIG. 1 shows, a capacitive-probe plate 34 is disposed adjacent to device 14 and in particular parallel to the lead frame that provides the lead-frame conductors such as conductor 32. A consequence of this arrangement is that a detectable capacitance exists between conductor 32 and probe plate 34.

If pin 12 is properly connected to node 16, therefore, this capacitance will appear between tester nail 22 and probe plate 34, which thereby forms a capacitive voltage divider by virtue of the capacitance between it and a second, ground probe plate 38. The capacitance between plates 34 and 38 is known, so the resultant voltage on plate 34 is an indication of the magnitude of the capacitance between nail 22 and plate 34, and this indication, buffered by amplifier 40, is converted to digital form and stored by means not shown. In the absence of factors to be described below, the resultant measured values for different pins would simply be proportional to the desired capacitances between the probe plate and the respective lead-frame conductors and thus substantially proportional to their respective surface areas.

Figure 3:
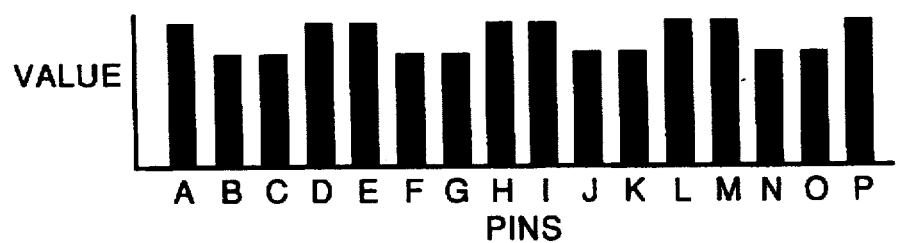
FIG. 3 is a graph of the capacitances between the capacitive-probe plate employed in the set up of FIG. 1 and the various lead-frame conductors shown in FIG. 2.

FIG. 3 depicts typical values of such measurements for a small integrated-circuit package that has only sixteen pins. That drawing shows that the outputs, if they represented simply the capacitances between the various lead-frame conductors and the capacitive-probe plate 34, would form a regular pattern representative of the different surface areas of the various lead-frame conductors. As will be explained below, certain aspects of the invention take advantage of the symmetry in these capacitance values that can be seen by simultaneous reference to FIGS. 2 and 3.

Since FIGS. 2 and 3 represent a simple square package that has only 16 pins, half of the capacitances are of one value and the other half are of another. Clearly, this is not the typical arrangement. But it should be apparent that one aspect of the illustrated pattern tends to prevail in integrated-circuit packages generally: conductors associated with pins on spatially opposite sides of the package will have the same surface areas and thus form nearly equal capacitances with the capacitive probe if the capacitive probe is, as is typical, positioned symmetrically with respect to the integrated-circuit package. The lead-frame conductors associated with pins C and K will have equal surface areas, for example.

The large number of equalities in the example results from the fact that opposite in this context means not only diametrically opposed but also opposed with respect to any of the axes of symmetry. Thus, the lead-frame conductors associated with pins C and J are equal because they are opposed with respect to the vertical axis of symmetry, while the lead-frame conductors associated with pins B and C are equal because they are opposed with respect to the horizontal axis of symmetry.

Now, if the capacitances represented by FIG. 3 were the only factors that entered into the results of the measurement, determination of whether a pin connection had been made properly would be relatively simple. Clearly, the occurrence of an open circuit that effectively disconnected the tester nail 22 from the lead-frame conductor associated with the open pin would largely eliminate the capacitance between the tester nail 22 and the probe plate 34. So placing a decision threshold at, say, half the lead-frame-conductor capacitance of one of the lower-capacitance pins would probably avoid the effects of measurement variations among boards of the same type as well as the small capacitance that would inherently exist between the nail and the probe plate.

But other factors do exist, and it is an advantage of the present invention that it takes certain of these factors into account in determining proper test thresholds. Because of these factors, the amplifier-40 outputs for a real reference board known to be good may turn out to be more like those depicted in FIG. 4. In this example, we have assumed that the board track to which pin A should be connected runs under the board device 14. This provides extra capacitance between the nail 22 and the probe plate 34, so the voltage depicted in FIG. 4 for pin A is higher than that which would result simply from its lead-frame-conductor capacitance. This additional capacitance does not depend on whether the pin 12 is properly connected, so the fraction of pin A's FIG. 4 voltage that results from this node-to-probe capacitance will be present even if the pin is not properly connected. We further assume that the measurements for others of the pins have greater or lesser connection-independent components for various reasons.

Figure 5A:
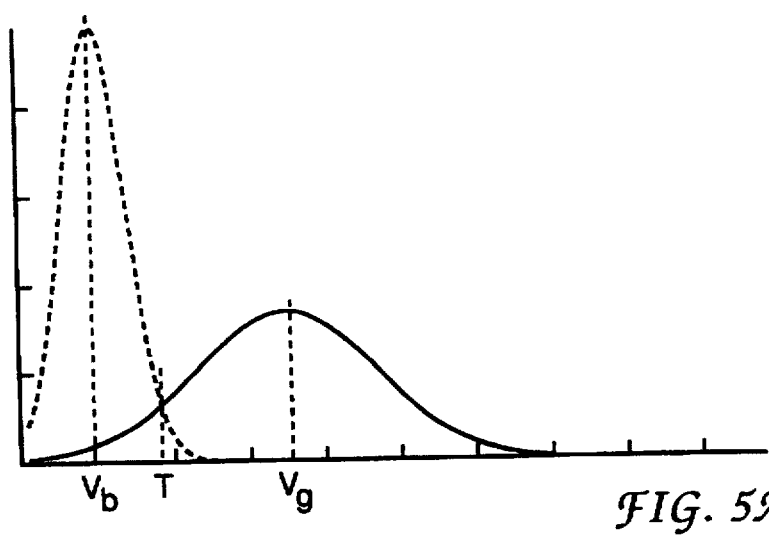
FIGS. 5A, B, and C are graphs of measurement probability densities for various pins.

These factors complicate the problem of setting a reliable test threshold. The manner in which this complication occurs can be appreciated by considering the measurements that might be taken for a given pin on various boards of the same type. Let us say that the solid-line curve in FIG. 5A represents the probability density, centered on a nominal good value $V_g$, of a given pin's measurement on boards on which that pin is properly connected, while the dashed-line curve represents the measurement probability density, centered on a nominal bad value $V_b$, for boards on which that pin is open. It is apparent that is the optimum threshold T for discriminating between pins that are properly connected and those that are not occurs approximately where the two curves overlap. (For the sake of illustration, the degree of overlap depicted in the drawing is somewhat greater than would be acceptable in many test situations.) Note that such a threshold permits some errors: some open pins will be judged to be connected, while some pins properly connected will be indicted as open. This threshold nonetheless enables the test to judge most pins properly, and it is the optimum threshold for this purpose.

Figure 5B:
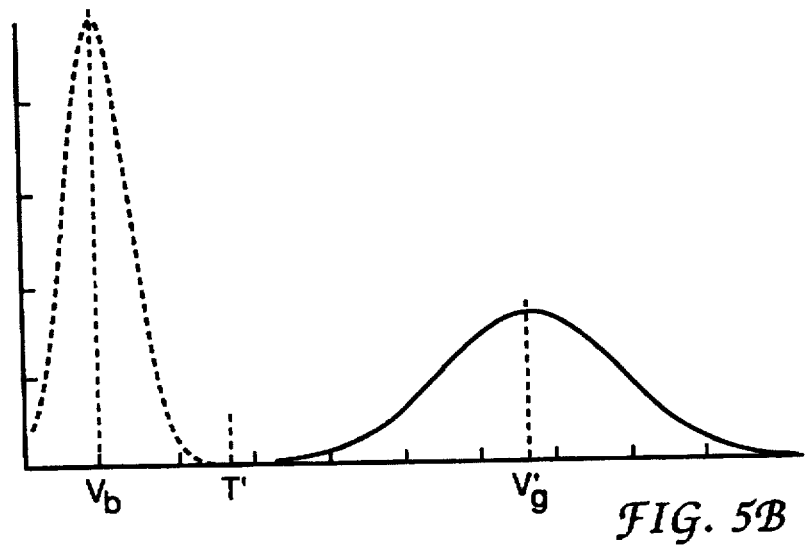

However, using such a threshold for all pins would lead to less-than-optimum results for the board test in general. For instance, suppose that FIG. 5B depicts the corresponding measurement probability densities for some other pin on the board. If threshold T were employed, more open circuits would be missed than is necessary. Specifically, if the threshold were placed at T' instead, fewer errors would occur for that particular pin. But T', too, is not the best threshold for all pins; T' clearly is not the best threshold to employ for the pin whose measurement probability densities FIG. 5A depicts.

One might conclude that a better way of setting the thresholds is to set the threshold for a given pin at, say, a given percentage of the measurement taken for that pin during training. (In many cases, the "measurement" is actually the average of corresponding measurements taken on a number of boards.) Such an approach does in fact lead to more-reliable results. But we have found a way of conveniently taking into account a further factor.

Figure 5C:
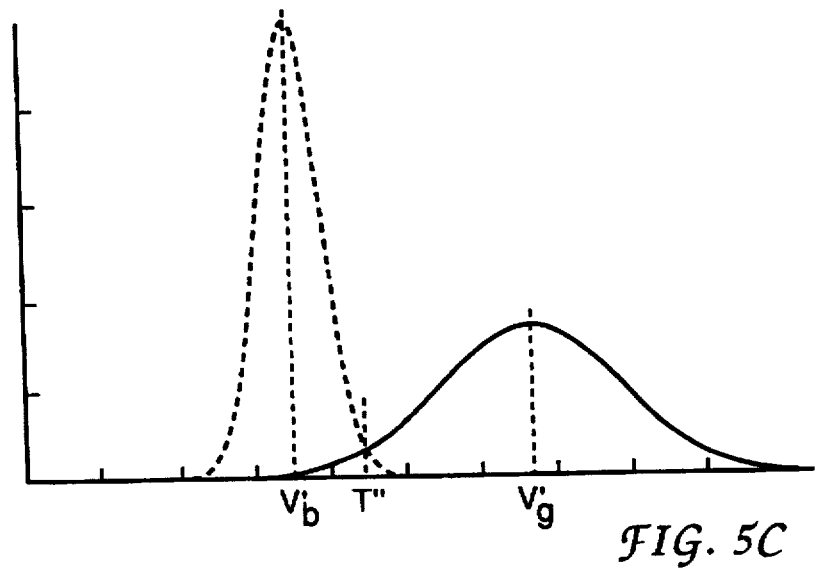

As was stated above, the nodes to which certain pins are to be connected run for significant distances immediately beneath the component and thus in close proximity to the capacitive probe. This results in a significant probe output even when the pin is open, and for such a pin the probability densities may look more like those depicted in FIG. 5C. If the threshold is computed simply as a predetermined percentage of the measurement taken during training, and if that percentage results in threshold T' whenever the training measurements gave the value $V'_g$ of FIGS. 5B and 5C, the resultant test would be essentially useless for pins of the type whose measurement probability densities are depicted in FIG. 5C, where the measurement has a significant connection-independent component. For the pin whose measurement probabilities are depicted by FIG. 5C, a better threshold would be T". Yet uniformly using the percentage that produces T" would not be desirable, since it would result in more erroneous open-circuit indications than necessary for the pin whose measurement probabilities FIG. 5B depicts.

Recognizing this factor, we choose the test thresholds in a manner that takes into account not only the nominal good-pin measurement $V_g$ but also an estimate of the nominal bad-pin measurement $V_b$. Of course, employing this approach requires that some value be obtained for $V_b$. One could obtain this during training by purposely disconnecting the pin in question, but this would be extremely inconvenient. As we explain in detail below, we instead obtain an estimate of this $V_b$ value from the $V_g$ values taken during training for other pins on the same board device. Then, at least if the $V_b$ value is relatively high, we make the threshold value higher than it would otherwise be for the same $V_g$ value.

Although we refer to the $V_b$ value as connection-independent, it should be understood that the independence to which we refer is relative. Specifically, we will assume for the sake of explanation that pins C and F are connected to the same board node. That is, they are shorted together, and we will refer to them as constituting a group of connected-together pins. The size of this group is two, since only two pins are connected together.

Now, the measurements depicted in FIG. 5C can represent, say, pin C. Since pins C and F are connected together, the $V'_g$ given there is the same for pins C and F. However, the $V'_b$ value is not the value that results when both pins are open; that value would be lower. The depicted $V'_b$ value is the value that results when only pin C is open, so part of that $V'_b$ value actually depends whether the pin F is connected. In some contexts, however, we will still refer to the entire $V_b$ value as being connection-independent, since it is independent of whether pin C is connected, although it does depend on whether pin F is connected.

Before we discuss in detail the manner in which the estimate of the connection-independent value is determined, we return briefly to FIG. 4 to discuss certain additional techniques that we employ to increase fault coverage.

Figure 4:
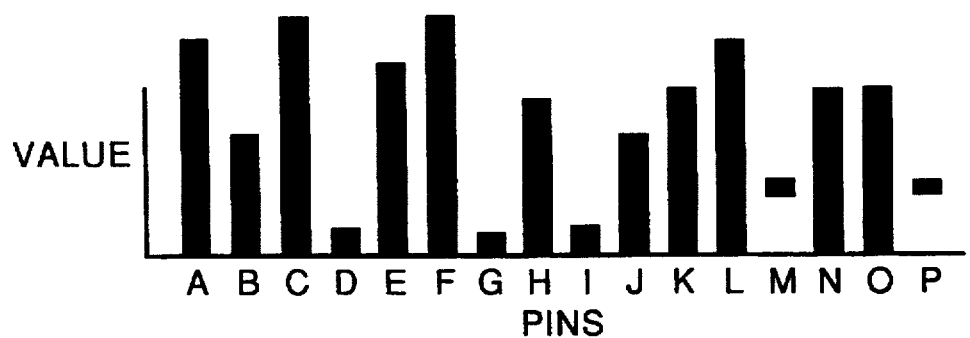
FIG. 4 is a graph of the measurements that result from the test setup of FIG. 1 when the source of FIG. 1 drives the board nodes associated with various ones of the device pins.

First, we note that FIG. 4 contains only dashes for pins M and P. This represents the fact that there is no direct nail access to the board nodes to which these nails are connected. In some cases, this simply means that those pins cannot be tested. However, it sometimes happens that a relatively low-impedance board component, such as a low-resistance resistor or high-capacitance capacitor, connects the inaccessible node to a node that is accessible. We therefore inspect the board to determine whether any two-terminal device is connected between the inaccessible node and a node to which access can be obtained. If so, a measurement is taken by driving that accessible node. If a signal of sufficient magnitude is thereby produced, the resultant measurement is stored with the values for the other pins. We will assume below that such a measurement is possible for pin P but not for pin M.

FIG. 4 also shows that pins D, G, and I have very low measurements. Sometimes this results from the fact that the driven node is connected through a low impedance to ground, and the source is thus effectively shorted. When this is an inherent feature of the board under test, the pin in question will, like pin M, be considered untestable. In other situations, however, the grounding is sometimes avoidable.

To understand this, it is necessary to consider the way in which in-circuit analog measurements, such as that of the capacitance between a board node and the probe plate 34, are conventionally performed. The component of interest in an in-circuit test is typically connected to a number of other components. These connections tend to make the measurement inaccurate if compensating measures are not taken. One such measure is to "guard" the component in question.

Roughly speaking, guarding means grounding nearby components to reduce the degree to which they affect the test. For instance, although it is intended for the test described above in connection with FIGS. 1 and 2 to detect only that part of the capacitance between node 16 and probe plate 34 that results from the direct coupling through pin 12 of that node to lead-frame conductor 32, coupling of the source 20 to other lead-frame conductors because of capacitive or other coupling between track 16 and other tracks, for instance, could contribute to the capacitance that is independent of the proper connection of pin 12 to track 16. In order to reduce these effects greatly, tracks that are connected to the other device pins such as pin 41 are grounded through other nails such as nail 42 so as to prevent that additional coupling. Typically, this is accomplished by using nails to contact those tracks directly. But if one or more of the tracks of interest is not accessible in that fashion, we use the above-described approach of having the nails contact tracks connected by low-impedance board components to the tracks of interest.

Now let us suppose that there is a board device, not shown, that provides a low-impedance connection between the tracks to which pins G and I are connected. In such a case, the tester's grounding, for guarding purposes, of the track to which pin I is connected while pin G is being tested will greatly load the source and thus result in a measurement that is too low to be useful, as FIG. 4 indicates for pin G and, consequently, for pin I as well.

Figure 6:
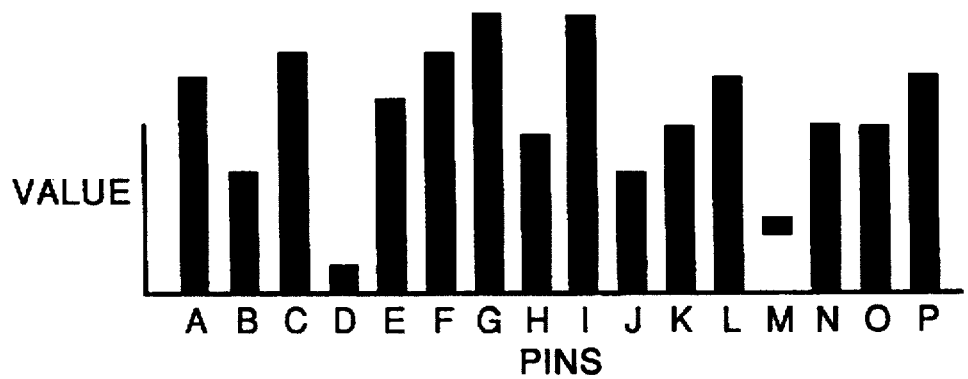
FIG. 6 is a graph similar to FIG. 4 but representing values that result when a different guarding strategy is employed.

But an adequate test can usually be performed without 100% guarding, so the low-output problem for pins G and I can be eliminated by simply not guarding pin G or I while the other is being tested. During the training process, therefore, we test all combinations of low-output pins to determine whether any are connected by low impedances to guarding pins, and we then adjust the test of that pin to eliminate guarding of the connected node. FIG. 6 depicts the result, showing that pins G and I now have high outputs. For the sake of discussion, we assume that the grounding of pin D during testing resulted not from guarding but from an inherent board connection, so pin D remains untestable. FIG. 6 also shows the result, described above, of driving through a low-impedance board component: pin P now has a measurement, but pin M does not.

We have now determined the connections to be used to make test measurements and have taken reference measurements with those connections. These steps are represented by block 46 of FIG. 7A, which together with FIG. 7B forms a block diagram of the overall training procedure. From these measurements we must set thresholds.

Figure 8:
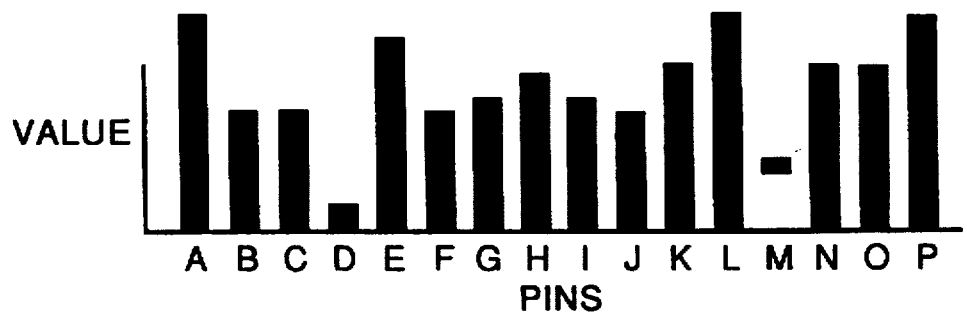
FIG. 8 is a graph of the values that result from adjusting those of FIG. 6 for the effects of connections between pins.

As was observed above, the raw reference measurements depicted in FIG. 6 are determined by the capacitances between the capacitive probe and the trackprobe and the tracks to which respective UUT pins should be connected. Now, the capacitance of interest for our purposes is that which results from only one lead-frame conductor. But some nodes are connects to more than one lead-frame conductor. To compensate for this fact, we identify each pin that the board connects to other pins on the same board device, and we divide the raw measurement value of FIG. 6 for that device by the number of pins in its group; i.e., if a pin is connected to N−1 other pins, its raw measurement value is divided by N. We know that pins C and F are connected together, and we also know that pins G and I are connected together, so we divide all their measurements by two in a step represented by flow-chart-block 48. FIG. 8 depicts the results.

As was stated above, the measurement for pin D is very low because of the source loading that the board imposes, and we consider it so low as to make pin D essentially untestable. However, other, testable pins' measurements are also subject to the effects of various degrees of loading. As a consequence, although their raw measurements are indicative of their respective capacitances, they are not proportional to them, and proportionality is needed in order to perform certain smoothing processes that follow. To compensate for loading and thus to obtain a better indication of capacitance, we determine the degree to which loading has occurred. Specifically, we take a voltage measurement at the driving nail, as indicated by amplifier 50 of FIG. 1. This enables us to compute a normalized pin-capacitance value V:

$$V = \frac{V_n}{V_s} V_m,$$

where $V_m$ is the measured value produced by amplifier 40, $V_n$ is the (known) no-load voltage of the source 20, and $V_s$ is the nail voltage represented by the output of amplifier 50.

Figure 9:
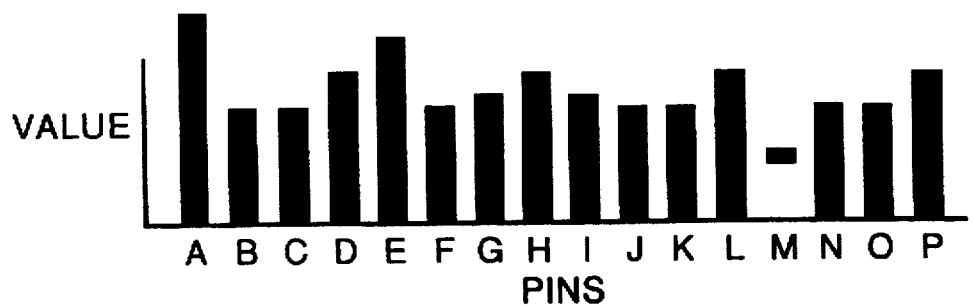
FIG. 9 is a graph of the results of normalizing the values of FIG. 8 for the effects of source loading.

Flow-chart blocks 52 and 54 represent performing this normalization step and saving the results, which FIG. 9 depicts. The group-compensation and loading-compensation steps, which respectively result in the data of FIGS. 8 and 9, can clearly be reversed, and the two sequences are equivalent for the purposes of the present invention.

While FIG. 9 depicts per-pin capacitance values, those values include not only the connection-dependent components on which the test is based but also connection-independent-components, which we want to suppress. To adjust the values in such a manner as to suppress the connection-independent components, we start with the assumptions (1) that the measurements most in need of adjustment are those that in some sense depart from the norm and (2) that adjusting them to more-normal values will tend to suppress their connection-independent components.

Block 56 represents inspecting the data for one criterion by which is we identify the measurements that need adjustment. Specifically, the mean of the FIG. 9 values is found, and those that differ from the mean by more than a predetermined amount are considered to require adjustment. (Although we typically determine the mean by simply averaging all of the values, some embodiments of the invention may be more selective in determining which values contribute to the mean. A determination was made previously that pin D is not testable, for instance, so one may elect not to use its value in determining the mean.) Any measurement that differs from the mean by, for example, more than half of the greatest difference or, alternatively, twice the average difference may be considered to require adjustment. Any measurement that falls outside the band thus defined is replaced with a value that, because of the regularity that can be expected in the pattern of lead-frame conductors' surface areas, is likely to be relatively close to the connection-dependent component of the measurement.

Specifically, a pin located opposite to the pin in question should have the same surface area, so we replace an out-of-band measurement for a given pin with, in essence, a "noise-suppressed" version of the opposite pin if the opposite pin's measurement is not itself outside the band. In the example, the measurement for pin A is outside the band, while the measurement for the pin diametrically opposite to it, namely, pin I, is not, and neither are those for pins H and J, which are adjacent to opposite pin L We therefore average those three measurements and replace the measurement for pin A with that average. If those measurements had not been within the band, we would have taken an average of those of the pins closest on the left and right of pin A whose measurements are within the band. We ordinarily use a simple average, but one could instead use, say, an average weighted in accordance with those pins' closeness to the one whose value is to be replaced.

Figures 7A, 7B:
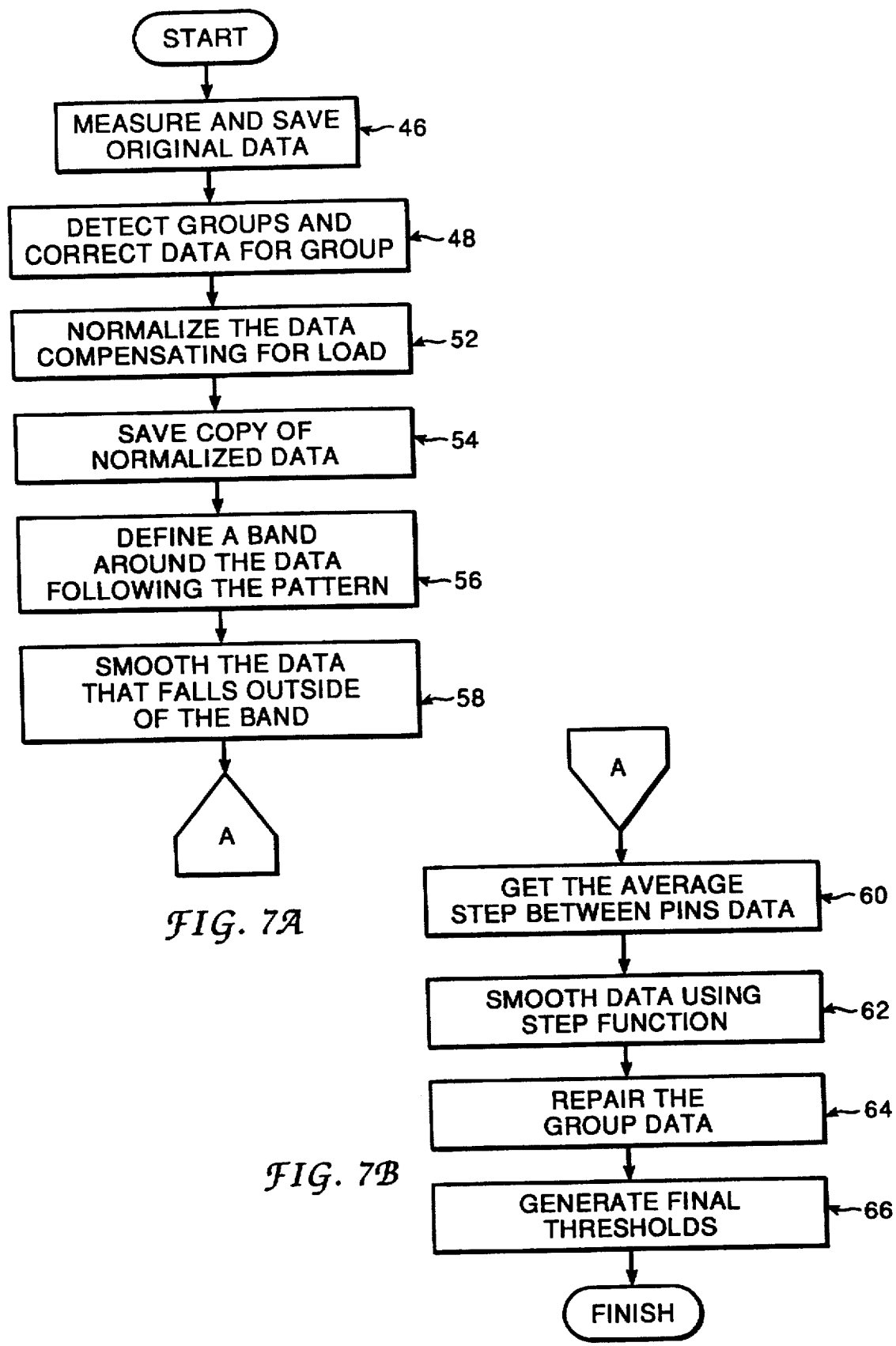
FIGS. 7A and 7B together constitute a flow chart of the training parts of the testing process.
Figure 10:
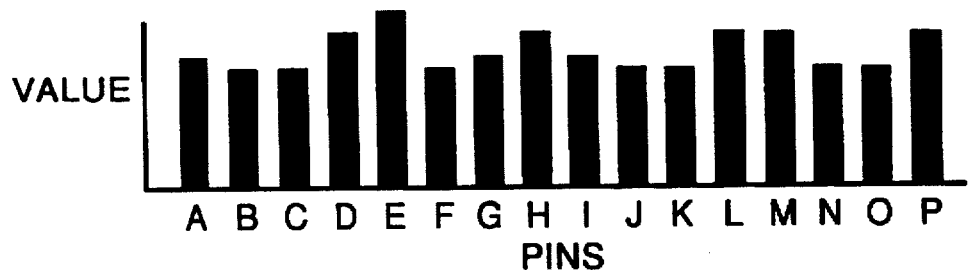
FIG. 10 is a graph of the results of adjusting the values of FIG. 9 to minimize additive effects by replacing atypically large or small measurements for given pins with values derived from other pins' measurements.

FIG. 10 represents the result of this step, represented by block 58 of FIG. 7A. Note that, even though pin M is inaccessible and thus untestable, a value has been assigned to it by averaging the measurements for pins D, E, and F. Obviously, such a step is not necessary, but we consider it desirable for use in the next step, in which we identify further candidates for measurement-value replacement in accordance with a step-size criterion.

Figure 11:
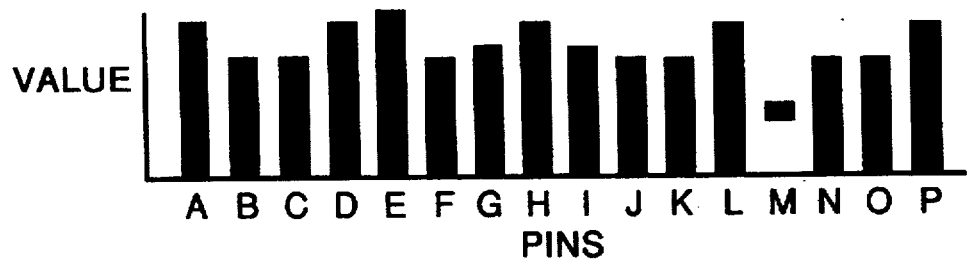
FIG. 11 is a graph of the results of smoothing further by reducing excessively large differences between the measurements taken for pins adjacent to each other.

To apply a second criterion for determining whether measurements need adjusting, we begin with the step represented by block 60 of FIG. 7B. In that step, we compute an average step size, i.e., the average of the absolute values of the differences between the measurements for pins adjacent to each other. For any step that exceeds, say, twice the average step size, the value for the second pin is so adjusted that the step size equals the average step size. The adjusted step size is positive or negative in accordance with the sign of the unadjusted step size. Flowchart block 62 represents this smoothing operation, while FIG. 11 depicts its results, which are our estimates of the connection-dependent components of the measured capacitances. Although these do not exactly equal the postulated values of FIG. 3, they are fairly close, and it is apparent that significant suppression of the connection-independent components has occurred.

Having obtained estimates of the various pins' connection-dependent measurement components, we are now in a position to calculate is test thresholds. The general approach to determining the test thresholds is to find the connection-independent part of the capacitance and then add to that connection-independent part a predetermined percentage, 30% in the illustrated embodiment, of the connection-dependent part.

Before we describe that approach, however, we will mention an exception. This exception occurs when the pin is a through-hole pin. As was stated above, pin 12 is connected to a track extension 26 (FIG. 1) located on the same side of the board as the component. This is typical of most components for which such capacitive open-circuit tests are performed. But there are instances in which the pin itself extends through a plated-through hole so as to extend physically to the opposite side of the board. For pins on such devices, we do not use the 30% rule just described, and, in fact, we do not attempt to separate the capacitance measurement into connection-dependent and connection-independent parts.

To understand the reason for this, it is important to make explicit an assumption that has tacitly been made in the discussion so far, namely, that the average connection-independent part is a relatively small percentage of the average total measurement even though the connection-independent part of any given pin's capacitance measurement may be a relatively large part of the overall measurement for that pin. We have found that this assumption tends to be valid for surface-mounted devices but not for devices having through-hole pins. The reason for this is that there is typically a relatively large capacitance between the conductive plated-through hole and the pin that extends through it even if there is no direct ohmic connection between them. Therefore, although one can employ the below-described technique of the present invention for through-hole pins, we have chosen not to because the resultant estimate of the connection-independent measurement component is not as good. For through-hole pins, we simply set the threshold for that pin to 60% of the training-process measurement depicted in FIG. 6.

We now turn to the procedure employed for SMT and similar pins. Even for such pins, we have in practice usually made an exception if the pin in question is connected to another pin. As will be seen below, there really is no reason in principle for making exceptions of such pins, but, since a disproportionately high number of connected-together pins turn out to be untestable anyway, the overall test reliability does not suffer greatly from not taking complete advantage of the estimates of those pins' connection-independent measurement components. For such pins, we simply assign the threshold in accordance with the following formula:

$$T = \left( \frac{N-1}{N} + K \right) V_m,$$

where T is the threshold, N is the number of pins in the pin group, K is a constant typically equal to 0.15, and $V_m$ is the measurement taken for that pin during training. As the number of pins in the group increases, the threshold that results from this formula becomes an increasingly high percentage of the measurement taken during training, and we consider the resultant test to be unreliable if this percentage is too high and thus leaves little room for manufacturing variation. So if the number of pins in the group exceeds three, we consider that group's pins untestable.

Although this formula does not use the distinction between connection-independent and connection-dependent measurement components, we do use our estimate of the latter in applying another is criterion for testability. If the connection-dependent component for one pin is less than 80% of that of any other pin in the same group, we consider the change caused by an open circuit at that pin to be too small in relative terms to permit it to be detected reliably, so we mark all pins in such a group untestable.

Figure 12:
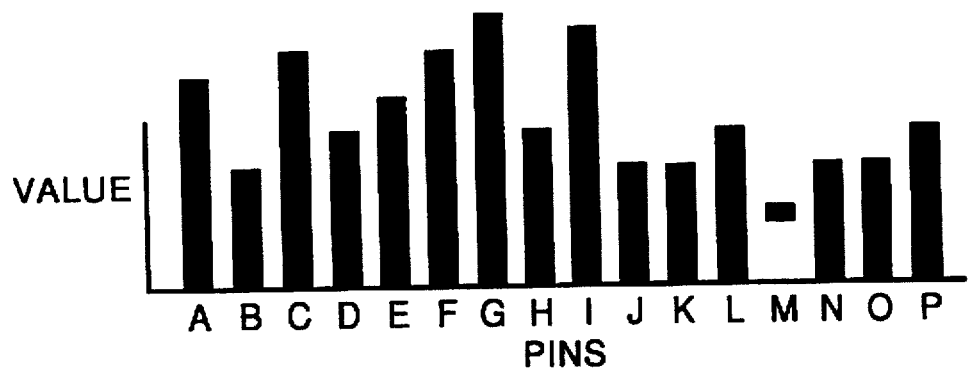
FIG. 12 is a graph of the results of multiplying connected-together pins' FIG. 9 values by the sizes of their respective groups.
Figure 13:
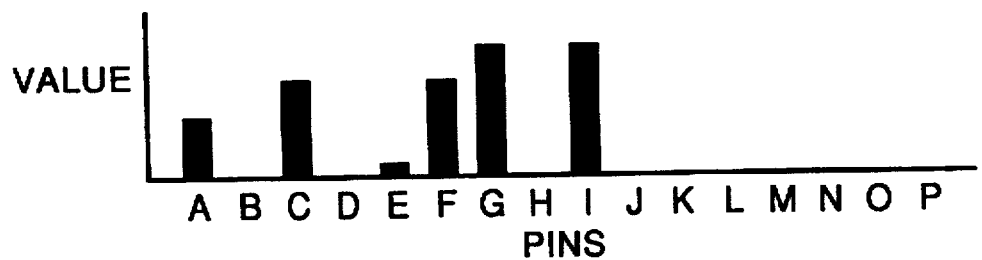
FIG. 13 is a graph of the independent-component estimates that result from subtracting the FIG. 11 values from the FIG. 12 values.
Figure 14:
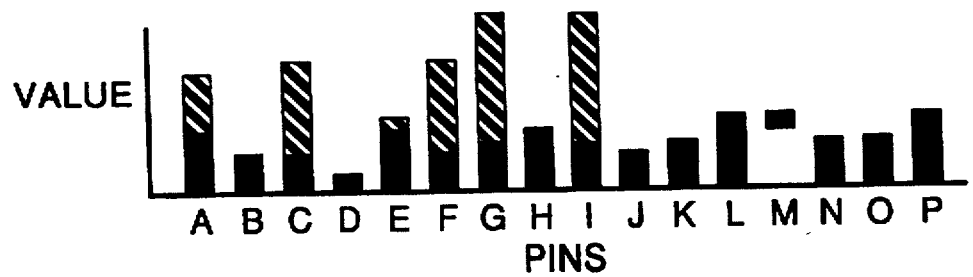
FIG. 14 is a graph of the resultant thresholds.

With one further exception to be mentioned below, we apply the 30% rule described above to the remaining pins' values. First, we identify the connection-independent component. For this purpose, we begin with the original capacitance data, i.e., the original measurements normalized for loading. FIG. 12 depicts these values, which are the same as those of FIG. 9 except that the data for connected-together pins have been multiplied by their respective group sizes in a step represented by flow-chart block 64, for reasons that will be explained below. The FIG. 11 estimate of the connection-dependent components are then subtracted from those FIG. 12 values to result in the connection-independent-component estimates depicted in FIG. 13. To these are added 30% of the connection-dependent components of FIG. 11 to produce normalized threshold values $T_n$, which are converted to the actual, de-normalized threshold values $T_a$ depicted in FIG. 14 in accordance with the following formula:

$$T_a = \frac{V_s}{V_n} T_n,$$

where $V_s$ and $V_n$ are the load and no-load source-voltage values determined during training for the pin in question. The cross-hatched parts of is the FIG. 14 bars represent the threshold increments caused by the connection-independent parts of the reference capacitance measurements. Block 66 represents this step. (In actual practice; of course, the two steps of subtracting the connection-dependent component and then adding 30% of it back would ordinarily be performed in one step: 70% of the connection-dependent component would be subtracted.)

The remaining exception referred to above occurs when the connection-independent component is an excessively large part of the total capacitance. We consider it to be excessive whenever the resultant threshold value exceeds 80% of the raw reference measurement of FIG. 6, so our system marks such pins untestable. We do this because in such situations we believe that manufacturing variations will cause the range of connected pins' measurements to overlap that of unconnected pins' measurements too greatly for the results of this type of test to be reliable.

It was stated above that there is no reason in principle not to adjust connected-together pins' thresholds in accordance with their measurements' connector-independent content. One could, for instance, obtain the threshold by adding to the connection-independent component 30% of the connection-dependent component. It is because of this possibility that the FIG. 9 data for connected-together pins were multiplied by the respective pins' group sizes to produce the FIG. 12 values. Those value are normalized versions of the original measurements for those pins, and subtracting the individual-pin values of FIG. 11 results in values that approximate the total of the connection-independent component and the connection-dependent components for all members of the group other than the pin whose threshold is being computed. For a given pin's threshold, in other words, the other group members' connection-dependent components are treated as part of the connection-independent part.

In practice, only a single test is performed for all pins in a whole group; the test determines whether one of the group's pins is open, but it does not determine which group member has the fault. Therefore, although the thresholds determined for different group members in accordance with the foregoing procedure are not the same in general, only one threshold is used. So the system could, say, pick one group member as the basis for the threshold or average the individually determined thresholds for all group members.

By employing the teachings of the present invention, we have been able to increase test reliability to a degree that, without employing the invention's techniques, could be achieved only by selectively opening each pin during testing. The invention thus represents a significant advance in the art.

The ability to deal with groups of pins provides another feature of the invention. Pins that are not connected together on the board 18 can be connected together by the multiplexer 23, thereby forming an "artificial" group. All of the connections in this group can then be tested in a single test, as though they were members of a board-connected group, thereby reducing the number of operations required for open-circuit testing of the component connections to the board.

To provide the desired reliability of an artificial-group test, the members of the group should have low connection-independent expected measurements and the expected measurements of the individual group members should be roughly the same. Accordingly, to form an artificial group, a pin is selected as the prospective first member of the group. If the connection-independent part of its expected measurement is less than a predetermined level, e.g. 5% of the total expected measurement, it is selected, otherwise it is rejected and the process begins with another pin.

After the first group member is selected, other pins having similar surface areas, because of symmetry or proximity, are examined as group members. Those that meet the connection-independent limitation on their individual expected measurements are prospective members of the group. Finally, those pins whose individual expected measurements are within a predetermined difference, e.g. 10% of each other, are selected as group members. Equivalently, the individual threshold of each group member should not differ from that of any other member by more than 10%.

Because the members of an artificial group can be selected in the foregoing manner, an artificial group can be somewhat larger, e.g. four members, than a board-connected group. Also, since the measurements of the members of an artificial group are made during training, the threshold calculation is governed by $$T = \left( \frac{N-1}{N} + K_a \right) V_{sum}$$

where $V_{sum}$ is the sum of the individual measurements and $K_a$ is a constant typically equal to 0.10.

The threshold for an artificial group is set somewhat on the high side so as to err more in the direction of false detection of open circuits. Then, if the group measurement indicates an open circuit, the multiplexer 23 can be configured to test the group members individually in order to provide a more reliable indication of the presence of an open circuit and to identify the involved pins if there is an open circuit.

The tests for shorts use the capacitance measurements that are used for opens detection, but compare them against higher thresholds. Specifically, the threshold, $T_s$, for the detection of a short from a pin to either of the two adjacent pins is set to the average of the expected measurements for the adjacent pins, multiplied by a fractional constant and added to the expected normal measurement for the first pin. Thus $$T_s = M_B + 0.3((M_A + M_C)/2)$$

where $M_B$ is the expected measurement of the pin in question and $M_A$ and $M_C$ are the expected measurements of the adjacent pins A and C. Alternatively, $$T_{SA} = M_B + 0.3 M_A,$$

or $$T_{SC} = M_B + 0.3 M_C$$

In either case a short is indicated by a measurement exceeding the shorts threshold. Using these expressions, shorts can be detected in one of two ways, depending on the connections to pin A or pin C. For example, if pin C does not have a test bed nail connected to it, either directly or by way of a circuit board trace, a short between pins B and C can be detected by comparing the measurement of pin B with the shorts threshold.

On the other hand, if a test bed nail is connected to pin C, the guarding arrangement will cause pin C to be connected essentially to ground. The short will thus reduce the drive voltage on pin B to be reduced and the measurement of pin B will drop below the open-circuit threshold T, indicating a bad connection to pin B. For the same reason, the short will cause the open-circuit test of pin C to indicate a bad connection to that pin.

Accordingly, whenever the open-circuit testing of a component indicates two open circuits, the guard is removed from one of the pins involved and the measurement of the other involved pin is repeated. If any of these measurements exceeds the shorts threshold, the problem is a short circuit. If the measurement still indicates an open circuit, the pin is indeed open. This procedure is readily extendable to the detection of more than two open circuits.

We claim:

1. For testing for the presence, on a circuit board of a given type on which is mounted a subject device that includes a plurality of UUT pins intended to be nominally electrical connected to board nodes respectively associated therewith, of any open circuit between subject ones of the UUT pins and the nodes associated therewith, by means of a test equipment that responds to the capacitances between a capacitive probe plate adjacent the device and the respective nodes associated with the UUT pins, a method comprising the steps of:

A. in the test equipment connecting together a group of nodes nominally connected to UUT pins that are not nominally connected together on the circuit board, B. making a measurement of the capacitance associated with the group of nodes and the probe plate, C. comparing the capacitance measurement with a first threshold proportional to the sum of the expected nominal capacitances between the probe plate and the individual ones of said group of nodes, and D. asserting an open-circuit in a nominal node-pin connection in the group if the capacitance measurement is less than said first threshold.

2. The method defined in claim 1 including the step of selecting said plurality of nodes, said step comprising:

A. selecting as a first member of the group a node whose connection-independent part of its expected measurement is less than a predetermined level; and B. selecting as further members of the group nodes whose connection-independent parts of their expected measurements are less than said predetermined level and whose individual expected capacitance measurements are within a predetermined difference of each other and of the expected capacitance measurement of said first member.

3. For testing for the presence, on a circuit board of a given type on which is mounted a subject device that includes a plurality of UUT pins nominally electrically connected to board nodes respectively associated therewith, of a short circuit between two or more of the UUT pins, by means of a test equipment that responds to the capacitances between a capacitive probe plate adjacent the device and the respective nodes associated with the UUT pins, a method comprising the steps of:

A. in the test equipment connecting together a group of nodes nominally connected to UUT pins that are not nominally connected together on the circuit board.

B. making a measurement of the capacitance associated with the group of nodes and the probe plate.

C. comparing the capacitance measurement with a first threshold proportional to the sum of the nominal capacitances between the probe plate and the individual ones of said group of nodes, and D. asserting a short circuit of a member of the group if the capacitance measurement is greater than said first threshold.

* * * * *